(12) United States Patent
Ju et al.

(10) Patent No.: US 10,490,944 B2
(45) Date of Patent: Nov. 26, 2019

(54) ELECTRICAL CONNECTOR HAVING TERMINALS WITH INCREASED VOLUMES

(71) Applicant: LOTES CO., LTD, Keelung (TW)

(72) Inventors: Ted Ju, Keelung (TW); Chien Chih Ho, Keelung (TW)

(73) Assignee: LOTES CO., LTD, Keelung (TW)

(*) Notice: Subject to any disclaimer, the term of this patent is extended or adjusted under 35 U.S.C. 154(b) by 0 days.

(21) Appl. No.: 16/221,750

(22) Filed: Dec. 17, 2018

(65) Prior Publication Data
US 2019/0190207 A1 Jun. 20, 2019

(30) Foreign Application Priority Data
Dec. 19, 2017 (CN) .......................... 2017 1 1370067

(51) Int. Cl.
| H01R 13/24 | (2006.01) |
| H01R 13/646 | (2011.01) |
| H01R 12/71 | (2011.01) |
| H01R 33/74 | (2006.01) |
| H01R 13/41 | (2006.01) |

(52) U.S. Cl.
CPC ......... *H01R 13/646* (2013.01); *H01R 12/716* (2013.01); *H01R 13/2492* (2013.01); *H01R 13/41* (2013.01); *H01R 33/74* (2013.01); H01R 12/714 (2013.01); H01R 13/2442 (2013.01); H01R 13/2457 (2013.01)

(58) Field of Classification Search
CPC ............ H01R 13/2442; H01R 13/2457; H01R 12/714
See application file for complete search history.

(56) References Cited

U.S. PATENT DOCUMENTS

| 6,530,788 B1 | 3/2003 | Ju | |
| 6,679,709 B2 * | 1/2004 | Takeuchi | H01R 12/57 439/83 |
| 6,702,594 B2 * | 3/2004 | Lee | H01R 4/028 439/70 |
| 6,955,545 B1 * | 10/2005 | Morana | H01R 13/112 439/83 |
| 7,922,548 B2 * | 4/2011 | Fan | H01R 12/57 439/66 |

(Continued)

FOREIGN PATENT DOCUMENTS

| CN | 206283019 U | 6/2017 |
| CN | 107230851 B | 4/2019 |

*Primary Examiner* — Tho D Ta
(74) *Attorney, Agent, or Firm* — Locke Lord LLP; Tim Tingkang Xia, Esq.

(57) ABSTRACT

An electrical connector mounted on a circuit board and used to be electrically connected to an electrical module includes an insulating body, and multiple terminals provided on the insulating body. At least one of the terminals has: a connecting portion; an elastic arm, bending and extending upward from the connecting portion for being electrically connected to the electrical module; two extending arms, extending from the connecting portion, each of the two extending arms having a free tail end; and an electrical connecting portion, located at one of the free tail ends of the two extending arms for electrically connecting the two extending arms, and for increasing the volume and surface area of the terminal, so as to reduce impedance and improve high frequency thereof.

22 Claims, 8 Drawing Sheets

(56) References Cited

U.S. PATENT DOCUMENTS

| | | | | |
|---|---|---|---|---|
| 8,215,998 B1* | 7/2012 | Ju | ................... | H01R 12/7076 |
| | | | | 439/626 |
| 8,277,230 B2* | 10/2012 | Huo | ................... | H01R 12/716 |
| | | | | 439/342 |
| 8,323,038 B2* | 12/2012 | Jin | ................... | H01R 12/714 |
| | | | | 439/66 |
| 8,708,716 B1* | 4/2014 | Ho | ................... | H01R 12/714 |
| | | | | 439/83 |

* cited by examiner

ELECTRICAL CONNECTOR HAVING TERMINALS WITH INCREASED VOLUMES

CROSS-REFERENCE TO RELATED PATENT APPLICATION

This non-provisional application claims priority to and the benefit of, pursuant to 35 U.S.C. § 119(a), patent application Serial No. CN201711370067.4 filed in China on Dec. 19, 2017. The disclosure of the above application is incorporated herein in its entirety by reference.

Some references, which may include patents, patent applications, and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector capable of improving a high-frequency performance.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Conventionally, an electrical connector is used for electrically conducting a circuit board and an electrical module. The electrical connector has an insulating body with multiple terminal grooves correspondingly accommodating multiple terminals. Each terminal is provided with a connecting portion, two elastic arms laterally extending from the connecting portion, and a soldering portion extending downward from the connecting portion. The elastic arms are used for electrically contacting the electrical module, and the soldering portion is used for electrically connecting the circuit board. An extending arm extends from each of two sides of the connecting portion, the extending direction of each extending arm is identical to the extending direction of each elastic arm, and a gap is provided between the two extending arms so as to abut the walls the terminal grooves respectively. The soldering portion is located in the corresponding terminal groove, and each soldering portion is correspondingly provided with a solder ball, such that the solder ball solders and fixes the terminal to the circuit board.

However, in recent years, the requirement for the high-frequency performance of an electrical connector is increasingly high. Since the volume and surface area of the terminal of the conventional electrical connector are smaller, the required high-frequency performance cannot be met.

Therefore, a heretofore unaddressed need to design a novel electrical connector exists in the art to address the aforementioned deficiencies and inadequacies.

SUMMARY

The present invention is directed to an electrical connector capable of increasing the volume of a terminal, thereby improving a high-frequency performance thereof.

To achieve the foregoing objective, the present invention adopts the following technical solutions. An electrical connector, mounted on a circuit board, and configured to be electrically connected to an electrical module, includes: an insulating body; and a plurality of terminals, provided on the insulating body, wherein at least one of the terminals has: a conductive portion, configured to electrically connect the terminal to the circuit board; a connecting portion; an elastic arm, bending and extending upward from the connecting portion, the elastic arm configured to be electrically connected to the electrical module; two extending arms, extending from the connecting portion, each of the two extending arms having a free tail end; and an electrical connecting portion, located at one of the free tail ends of the two extending arms, and configured to electrically connect the two extending arms.

In certain embodiments, one of the free tail ends of the two extending arms has an end portion, and the end portion is the electrical connecting portion, configured to electrically connect the other one of the free tail ends of the two extending arms.

In certain embodiments, the electrical connecting portion is a metal sheet fixed to the one of the free tail ends of the two extending arms, and configured to connect the two free tail ends of the two extending arms.

In certain embodiments, the two extending arms and the connecting portion form a tubular structure, and the electrical connecting portion connects the two extending arms, such that the tubular structure forms a closed loop.

In certain embodiments, the two extending arms are provided to be bending, and the two free tail ends of the two extending arms face each other.

In certain embodiments, each of the two free tail ends has an end portion, the end portion is a cutting surface of the corresponding extending arm, and the two end portions of the two free tail ends are parallel and opposite to each other.

In certain embodiments, the two free tail ends of the two extending arms and the connecting portion are opposite to each other in a direction perpendicular to the connecting portion.

In certain embodiments, the elastic arm has a base end connected to the connecting portion and a contact portion formed by bending from the base end, the contact portion is configured to be electrically connected to the electrical module, and the two extending arms are located below the base end.

In certain embodiments, at least one protruding portion laterally protrudes from the base end, and is configured to be interference fixed with the insulating body in an interference manner.

In certain embodiments, each of two sides of the base end has one protruding portion respectively, and the two protruding portions at the two sides of the base end are provided to be vertically staggered.

In certain embodiments, the base end is torn to form a strip connecting portion, and one of the protruding portions is located on the strip connecting portion.

In certain embodiments, the contact portion has a through slot, such that the contact portion forms two contact points located on two sides of the through slot.

In certain embodiments, the base end has at least one strip connecting portion configured to be connected to a strip, and the strip connecting portion is located on at least one side of the contact portion.

In certain embodiments, the electrical connector further has a solder provided on the conductive portion, and the solder does not extend upward beyond the extending arms.

In certain embodiments, the conductive portion extends downward from the connecting portion, the conductive portion bends to form a conductive surface, the solder is provided on the conductive surface, and the conductive surface overlaps with projections of the extending arms, the elastic arm and the solder in a vertical direction.

In certain embodiments, lower ends of the two extending arms and a lower end of the connecting portion jointly form the conductive portion.

In certain embodiments, the insulating body has a plurality of terminal grooves configured to accommodate the terminals, each of the terminal grooves has a plurality of walls surrounding the terminal groove, a fastening block protrudes from one of the walls, and one of the free tail ends is torn to form a fastening sheet configured to limit and fit with the fastening block.

Compared with the related art, an electrical connecting portion enables two free tail ends of the extending arms of a connecting portion of the terminal to be electrically connected. The electrical connecting portion increases the volume of the terminal, thereby reducing the impedance of the terminal, and improving the high-frequency performance of the electrical connector.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to an electrical connector.

Figure 1:
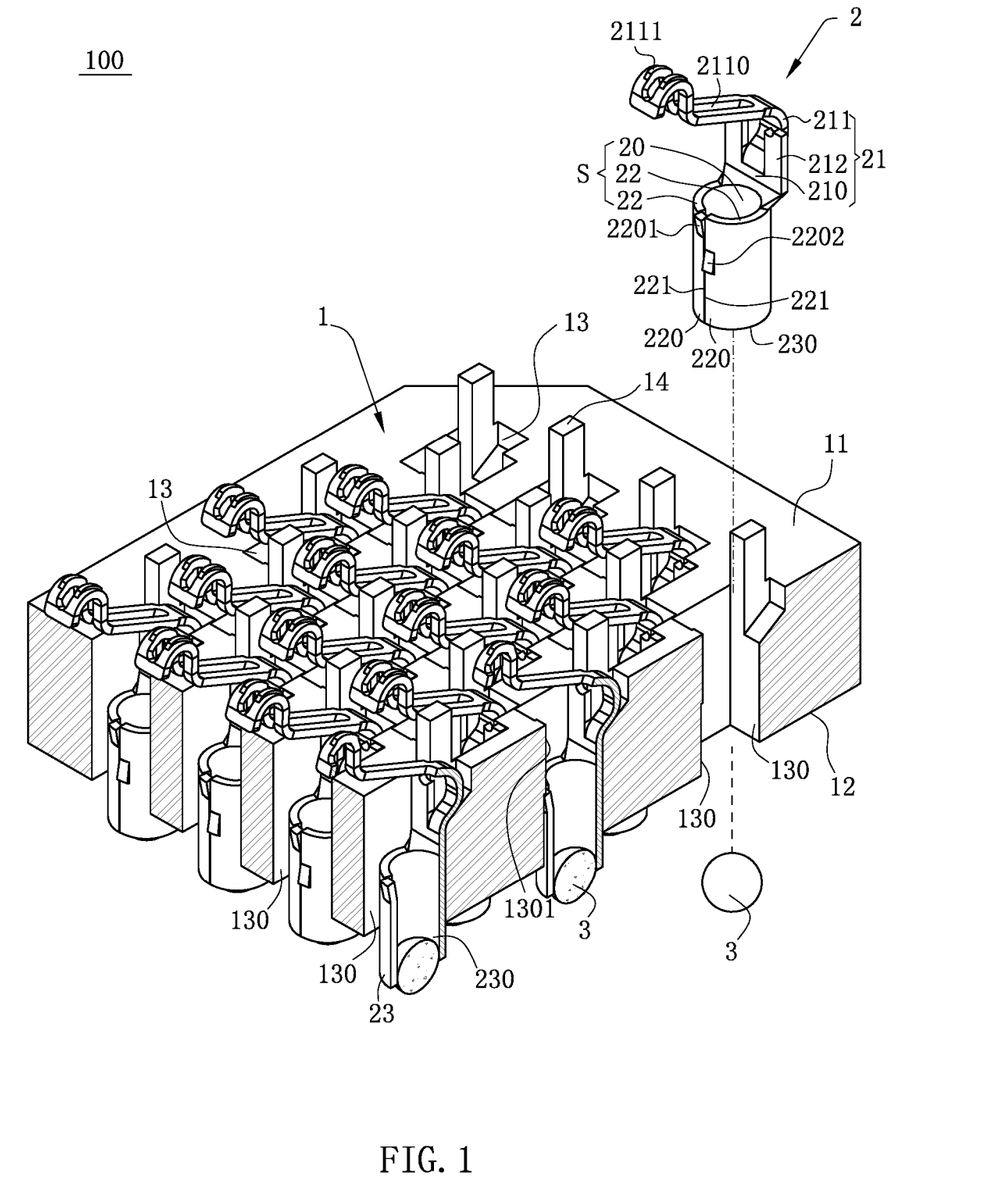
FIG. 1 is a local perspective sectional view and a perspective exploded view of an electrical connector 100 according to a first embodiment of the present invention.
Figure 2:
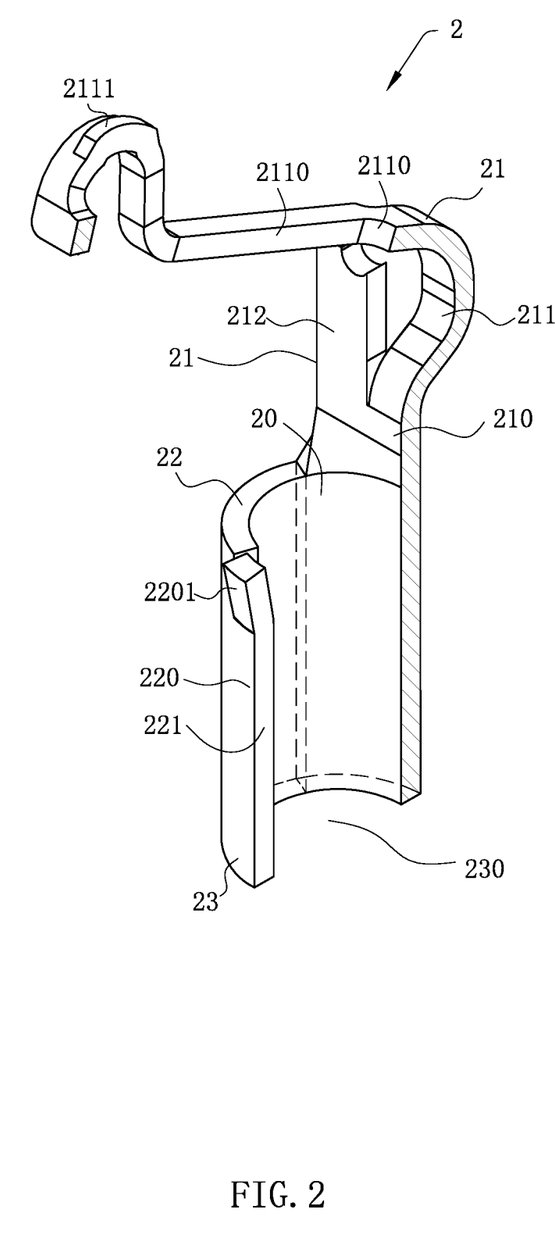
FIG. 2 is a perspective sectional view of the terminal in FIG. 1.
Figure 3:
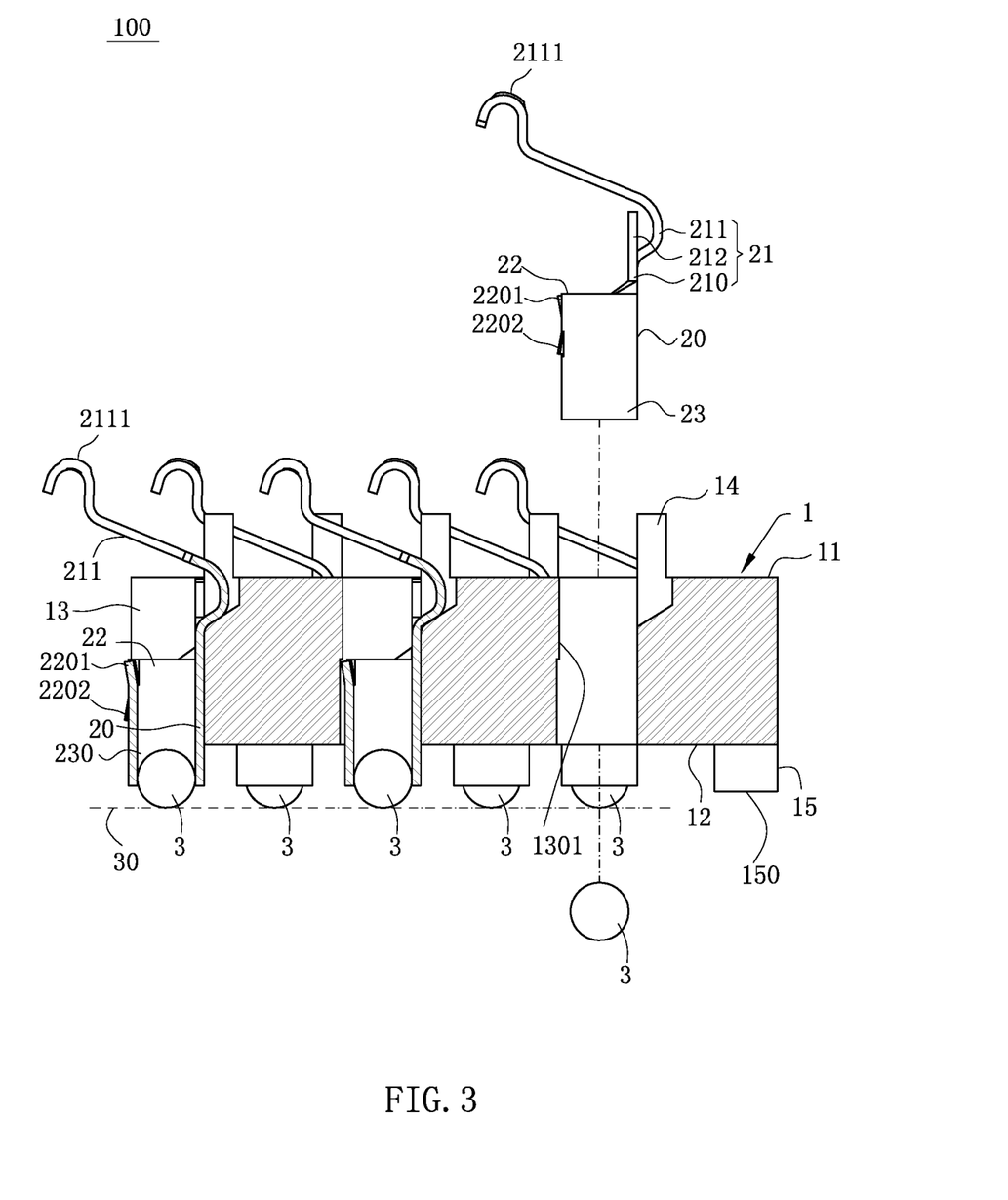
FIG. 3 is a plain view of the electrical connector in FIG. 1.

FIG. 1, FIG. 2 and FIG. 3 show an electrical connector 100 according to a first embodiment of the present invention. The electrical connector 100 includes an insulating body 1, used to be mounted on a circuit board 300 downward and support an electrical module 200. In the present embodiment, the electrical module 200 is a CPU module. Multiple terminals 2 are provided in the insulating body 1, and are used for electrically conducting the electrical module 200 and the circuit board 300.

Referring to FIG. 1, FIG. 2 and FIG. 3, the insulating body 1 is made of plastics. The insulating body 1 has an upper surface 11 and a lower surface 12 opposite to each other, and multiple terminal grooves 13. Each terminal groove 13 penetrates through the upper surface 11 and the lower surface 12. Each terminal groove 13 has four walls 130, which surround the terminal groove 13. An upper fastening block 1301 and a lower fastening block 1302 protrude from one of the walls 130. The upper fastening block 1301 extends to the upper surface 11, the lower fastening block 1302 extends to the lower surface 12, and the upper fastening block 1301 and the lower fastening block 1302 are provided to be staggered in a vertical direction.

Figure 4:
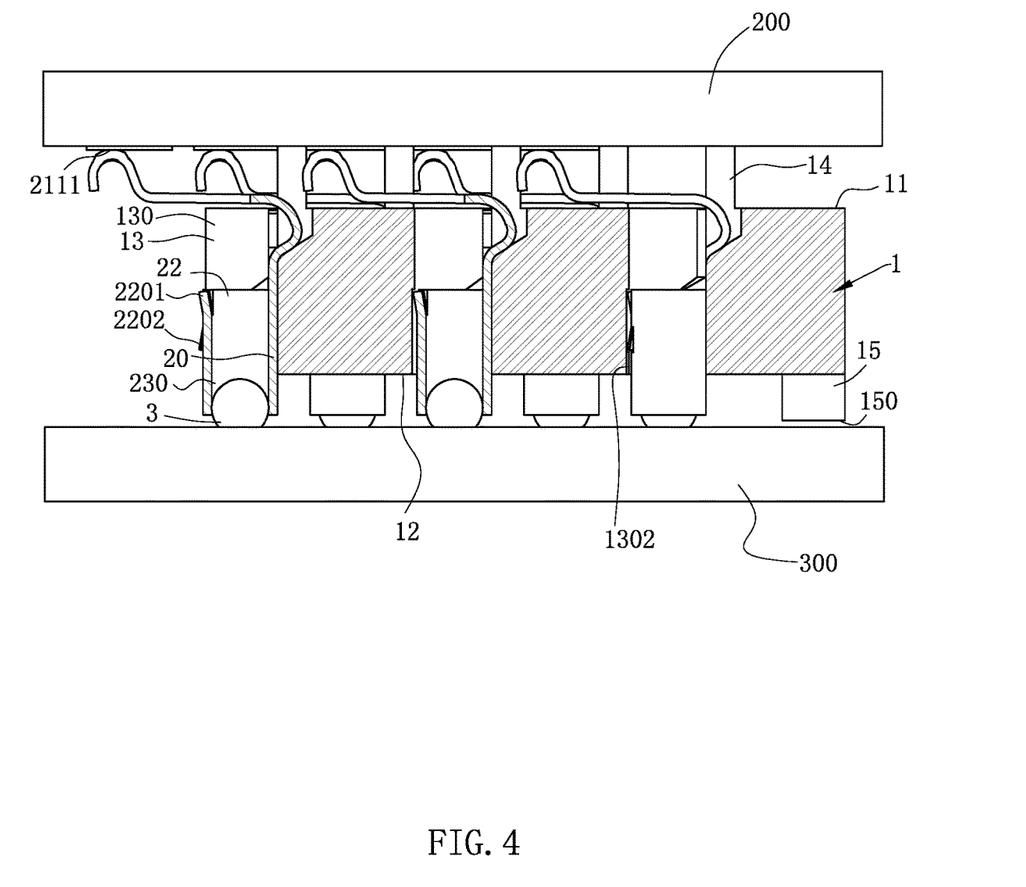
FIG. 4 is a plain view of the electrical connector in FIG. 1 being mounted on a circuit board before entering a high-temperature reflow oven.

Referring to FIG. 1, FIG. 3 and FIG. 4, multiple bearing blocks 14 extend upward from the upper surface 11 for bearing the electrical module 200, such that a gap is provided between the electrical module 200 and the upper surface 11, thereby preventing the electrical module 200 from being in direct contact with the upper surface 11. Each bearing block 14 is provided at a corner of the corresponding terminal groove 13. Multiple supporting blocks 15 extend downward from the lower surface 12 for supporting the insulating body 1 on the circuit board 300, and ensuring that a gap is maintained between the lower surface 12 and the circuit board 300.

In the present embodiment, the supporting blocks 15 have the same height in the vertical direction, and the height of the supporting blocks 15 in the vertical direction is smaller than the height of the supporting blocks 14 in the vertical direction.

Referring to FIG. 1, FIG. 2 and FIG. 4, the terminals 2 are correspondingly retained in the terminal grooves 13 respectively. Each terminal 2 has a connecting portion 20, and the connecting portion 20 is accommodated in the terminal groove 13.

Referring to FIG. 1, FIG. 2 and FIG. 3, an elastic arm 21 extends upward from the connecting portion 20. The elastic arm 21 has a base end 210 connected to the connecting portion 20, where the middle of the base end 210 is torn to form a contact portion 211, and two strip connecting portions 212 located at two sides of the contact portion 211. The contact portion 211 is used for being in contact with the electrical module 200, and the strip connecting portions 212 are used for connecting strips.

Referring to FIG. 1, FIG. 2 and FIG. 3, the contact portion 211 is formed by bending and extending upward beyond the upper surface 11, such that the contact portion 211 is exposed from the upper surface 11. Moreover, the contact portion 211 extends upward beyond the bearing blocks 14, such that when the electrical module 200 is supported on the bearing blocks 14, the electrical module 200 may be in contact with the contact portion 211, and the contact portion 211 may be elastically deformed, thereby providing a more stable contact between the electrical module 200 and the contact portion 211.

Referring to FIG. 1, FIG. 2 and FIG. 3, the contact portion 211 has a through slot 2110, and the through slot 2110 penetrates through the contact portion 211 such that the contact portion 211 forms two contact points 2111 located at two sides of the through slot 2110, thereby increasing the quantity of the contact points 2111. Each contact point 2111 is an electrical contact position between the contact portion 211 and the CPU. The increase of the contact points 2111 is beneficial to performance stability of an electrical connection between the contact portion 211 and the electrical module 200, such that when the electrical module 200 moves, the case can be avoid where there is only one contact point 2111 and bad contact between the contact point 2111 and the electrical module 200.

Referring to FIG. 1 and FIG. 2, two extending arms 22 are provided opposite to each other and laterally extend from the connecting portion 20 respectively, and the two extending arms 22 are provided to bend toward each other, such that the two extending arms 22 and the connecting portion 20 form a tubular structure S. Each extending arm 22 has a free tail end 220, and the two free tail ends 220 and the connecting portion 20 are provided to be opposite to each other in a direction perpendicular to the connecting portion 20. Each free tail end 220 has an end portion 221, and the end portion 221 is a cutting surface of the free tail end 220. The two end portions 221 are provided to be parallel to each other and abut each other to form electrical conduction. In this case, the end portion 221 functions as an electrical connecting portion electrically connecting the two extending arms 22, such that the tubular structure S forms a closed loop. The two end portions 221 abut each other, which is more beneficial in increasing the volume and surface area of the terminal 2 in comparison with the case where a gap is provided between the extending arms in the related art, thereby reducing the impedance of the terminal 2, and improving the high-frequency performance of the electrical connector 100.

Figure 5:
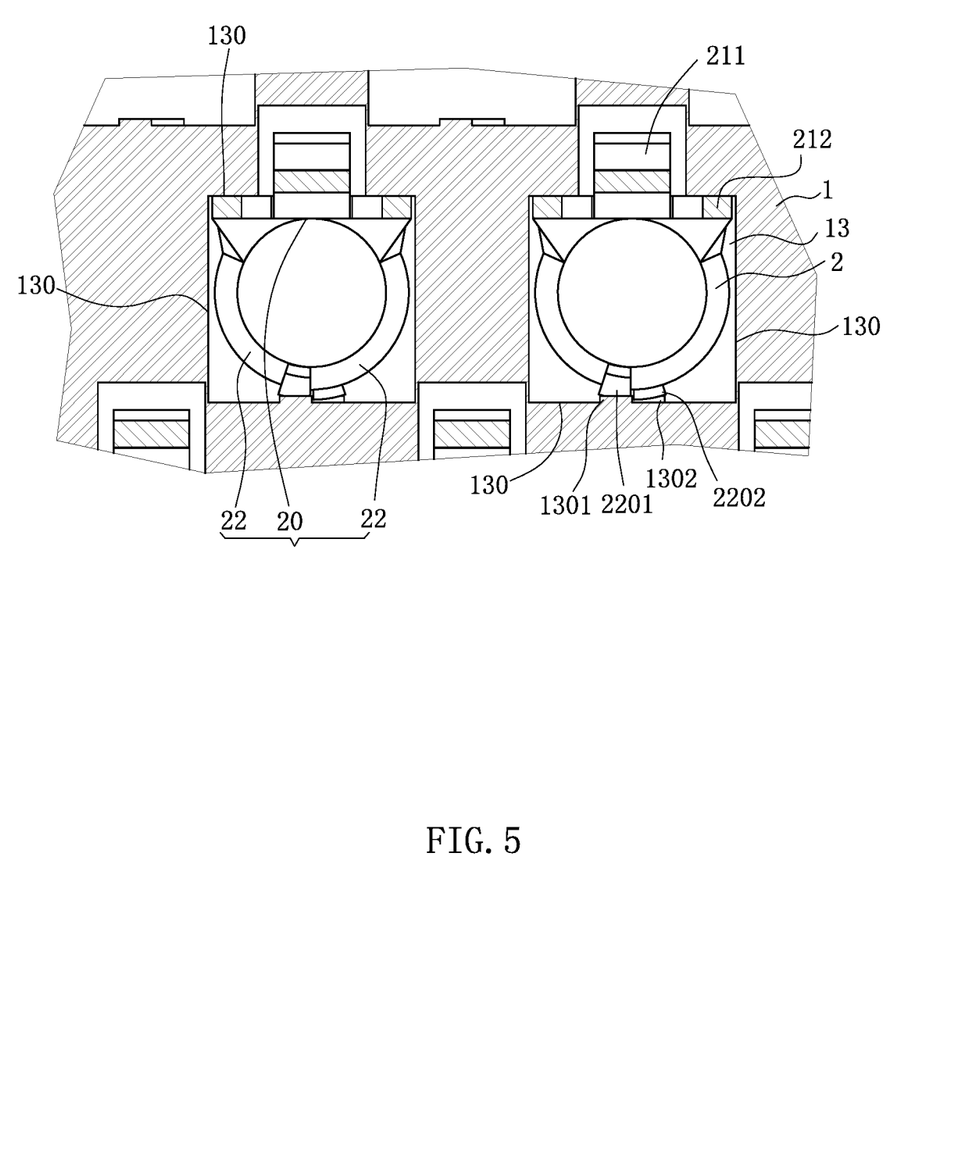
FIG. 5 is a sectional view of an insulating body and the terminal of the electrical connector in FIG. 1 viewing downward from the top.

Referring to FIG. 1, FIG. 2 and FIG. 5, one of the free tail ends 220 is torn to form an upper fastening sheet 2201, and the other free tail end 220 is torn to form a lower fastening sheet 2202. The upper fastening sheet 2201 and the lower fastening sheet 2202 are provided to be staggered in the vertical direction. The upper fastening sheet 2201 is in fastening fit with the upper fastening block 1301 correspondingly in the vertical direction, and the lower fastening sheet 2202 is in fastening fit with the lower fastening block 1302 correspondingly in the vertical direction, such that the insulating body 1 facilitates limiting the position of the terminal 2 vertically. The upper fastening sheet 2201 and the lower fastening sheet 2202 are provided at different free tail ends 220 respectively, thereby facilitating the strength of the extending arm 22 and the fixing stability of the terminal 2 and the terminal groove 13.

Referring to FIG. 1, FIG. 3 and FIG. 4, lower ends of the two extending arms 22 and a lower end of the connecting portion 20 are exposed beyond the lower surface 12. That is, a lower end of the tubular structure S is exposed beyond the lower surface 12, so as to form a conductive portion 23 for being electrically connected to the circuit board 300. The conductive portion 23 extends downward and does not go beyond the supporting blocks 15, such that when the electrical connector 100 is mounted on the circuit board 300, the supporting blocks 15 are in contact with the circuit board 300 earlier than the conductive portion 23, thus resulting in the supporting blocks 15 achieving good supporting effects. The conductive portion 23 has a soldering slot 230 for accommodating a solder 3. In the present embodiment, the solder 3 is a solder ball 3. An upper end of each extending arm 22 is located above the solder 3 and in the terminal groove 13, thus increasing the volume and surface area of the terminal 2, thereby reducing the impedance of the terminal 2, and improving the high-frequency performance of the electrical connector 100.

Referring to FIG. 1, FIG. 3 and FIG. 4, after the electrical connector 100 is mounted on the circuit board 300, the solder ball is in contact with a pad of the circuit board 300, and the solder ball 3 is fusion-soldered by a high-temperature reflow oven, such that the conductive portion 23 is soldered to the pad of the circuit board 300. Before the electrical connector 100 passes through the high-temperature reflow oven, a first plane 30 is defined by lower ends of multiple solder balls 3, and a second plane 150 is defined by lower ends of multiple supporting blocks 15. The first plane 30 is located below the second plane 150, and a certain gap is provided therebetween, thereby ensuring contact between the solder balls 3 and the pad of the circuit board 300, and preventing from missing solder of the conductive portion 23 and short-circuiting of the terminal 2. When the electrical connector 100 passes through the high-temperature reflow oven, the gap between the first plane 30 and the second plane 150 is reduced slowly due to fusion of the solder ball 3, and the electrical connector 100 slightly moves downward until the supporting blocks 15 are supported on the circuit board 300, thereby preventing the solder ball 3 from being crushed by the electrical connector 100. After the electrical connector 100 passes through the high-temperature reflow oven, the first plane 30 is flush with the second plane 150.

Figure 6:
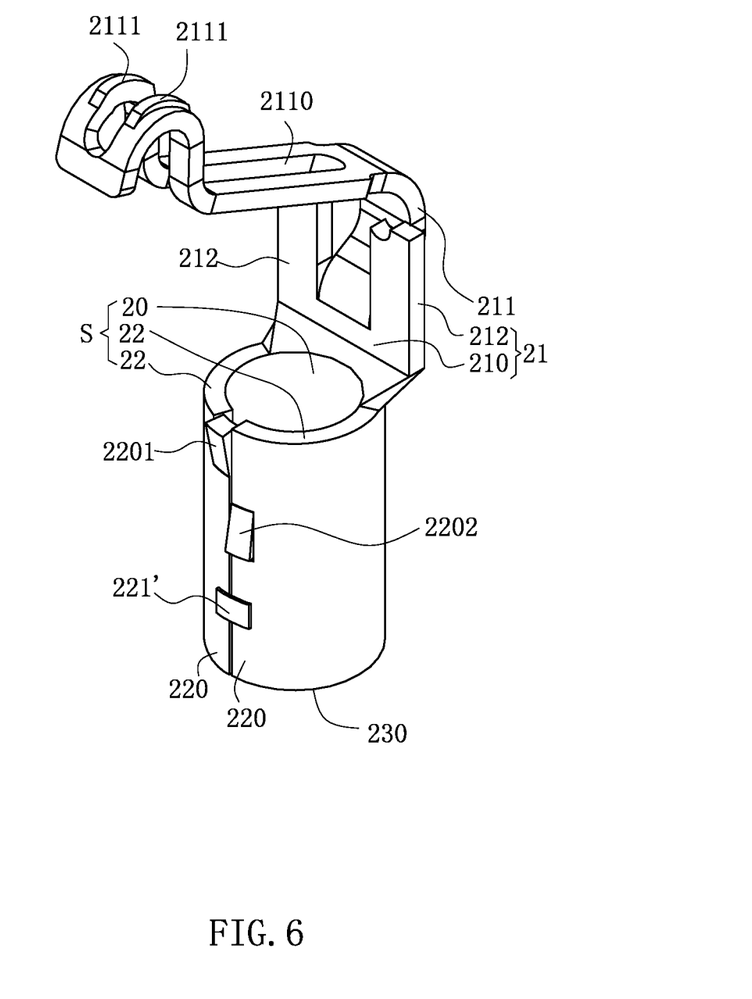
FIG. 6 is a perspective view of a terminal according to a second embodiment of the present invention.

FIG. 6 shows a second embodiment of the present invention. The difference between the second embodiment and the first embodiment exists in that an electrical connecting portion 221' may be made of a conductive material such as a metal sheet, and is used for connecting the two free tail ends 220, so as to implement an electrical connection between the two free tail ends 220, thereby forming a closed loop by the connecting portion 20, the two extending arms 22 and the electrical connecting portion 221'. The electrical connecting portion 221' increases the volume of the terminal 2, thereby reducing the impedance of the terminal 2, and improving the high-frequency performance of the electrical connector 100.

Figure 7:
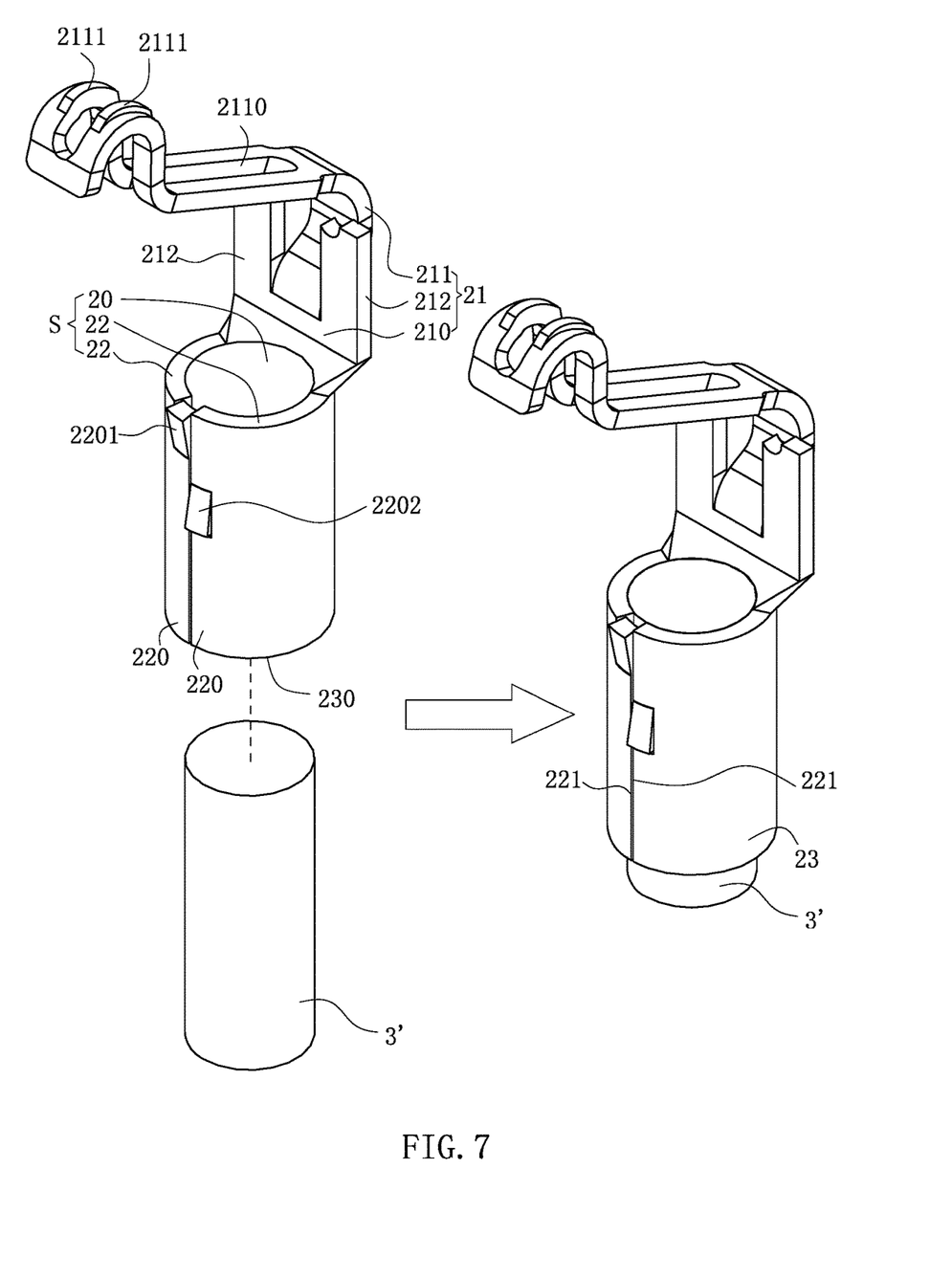
FIG. 7 is a perspective view of a terminal and a solder according to a third embodiment of the present invention.

In addition, FIG. 7 shows a third embodiment of the present invention. The difference between the third embodiment and the first embodiment exists in that multiple solders 3' are provided. Each solder 3' is a solder column. An upper end of the solder column 3' is flush with an upper end of the extending arm 22, and a lower end of the solder column 3' extends downward beyond the conductive portion 23 and the supporting blocks 15.

Figure 8:
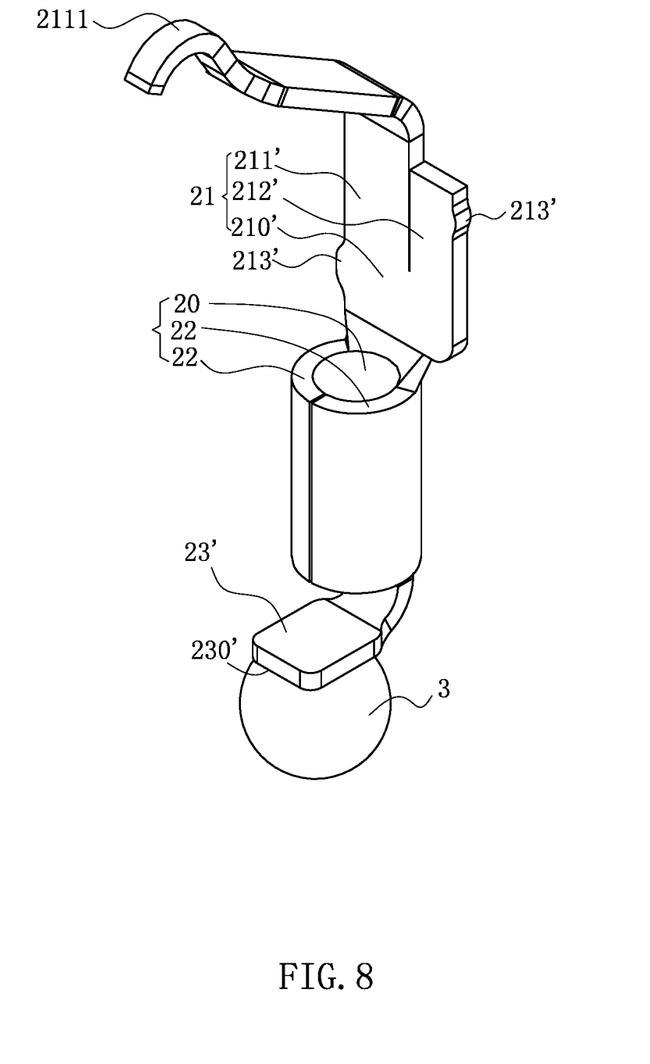
FIG. 8 is a perspective view of a terminal and a solder according to a fourth embodiment of the present invention.

FIG. 8 shows a fourth embodiment of the present invention. The difference between the fourth embodiment and the first embodiment exists in that the base end 210' is torn to form a contact portion 211' and a strip connecting portion 212' located at one side of the contact portion 211'. A protruding portion 213' protrudes from each of two sides of the base end 210' laterally, and is used for abutting the walls 130. One of the protruding portions 213' is provided on the contact portion 211', the other protruding portion 213' is provided on the strip connecting portion 212', and the two protruding portions 213' are provided to be staggered in the vertical direction, such that the two protruding portions 213' abut and fix to the walls 130 at different heights, thereby ensuring fixing between the terminal 2 and the terminal groove 13, and ensuring the strength of the insulating body 1.

A conductive portion 23' bends and extends downward from the connecting portion 20, and the extending arm 22 is located above the conductive portion 23'. A lower end of the conductive portion 23' has a conduction surface 230', and the solder 3 is provided on the conduction surface 230'. Projections of the elastic arm 21, the extending arm 22, the conduction surface 230' and the solder 3 in the vertical direction are overlapped.

To sum up, the electrical connector 100 according to certain embodiments of the present invention has the following beneficial effects.

1. Each free tail end 220 has an end portion 221, and the end portion 221 is a cutting surface of the free tail end 220. The two end portions 221 are provided to be parallel to each other and abut each other to form electrical conduction. In this case, the end portion 221 functions as an electrical connecting portion 221 electrically connecting the two extending arms 22, such that the tubular structure S forms a closed loop. The two end portions 221 abut each other, which is more beneficial in increasing the volume and surface area of the terminal 2 in comparison with the case where a gap is provided between the extending arms 22 in the related art, thereby reducing the impedance of the terminal 2, and improving the high-frequency performance of the electrical connector 100.

2. An electrical connecting portion 221' may be made of a conductive material such as a metal sheet, and is used for connecting the two free tail ends 220, so as to implement an electrical connection between the two free tail ends 220, thereby forming a closed loop by the connecting portion 20, the two extending arms 22 and the electrical connecting portion 221'. The electrical connecting portion 221' increases the volume of the terminal 2, thereby reducing the impedance of the terminal 2, and improving the high-frequency performance of the electrical connector 100.

3. The contact portion 211 (211') extends upward beyond the bearing blocks 14, such that when the electrical module 200 is supported on the bearing blocks 14, the electrical module 200 may be in contact with the contact portion 211 (211'), and the contact portion 211 may be elastically deformed, thereby providing a more stable contact between the electrical module 200 and the contact portion 211 (211').

4. The contact portion 211 has a through slot 2110, and the through slot 2110 penetrates through the contact portion 211 such that the contact portion 211 forms two contact points 2111 located at two sides of the through slot 2110, thereby increasing the quantity of the contact points 2111. The increase of the contact points 2111 is beneficial to performance stability of an electrical connection between the contact portion 211 and the electrical module 200, such that when the electrical module 200 moves, the case can be avoid where there is only one contact point 2111 and bad contact between the contact point 2111 and the electrical module 200.

5. One of the free tail ends 220 is torn to form an upper fastening sheet 2201, and the other free tail end 220 is torn to form a lower fastening sheet 2202. The upper fastening sheet 2201 and the lower fastening sheet 2202 are provided to be staggered in the vertical direction. The upper fastening sheet 2201 and the lower fastening sheet 2202 are provided at different free tail ends 220 respectively, thereby facilitating the strength of the extending arm 22 and the fixing stability of the terminal 2 and the terminal groove 13.

6. The conductive portion 23 (23') extends downward and does not go beyond the supporting blocks 15, such that when the electrical connector 100 is mounted on the circuit board 300, the conductive portion 23 (23') is prevented from being first in contact with the circuit board 300, thus resulting in the supporting blocks 15 not achieving good supporting effects.

7. Before the electrical connector 100 passes through the high-temperature reflow oven, a first plane is defined by lower ends of multiple solder balls 3, and a second plane 150 is defined by lower ends of multiple supporting blocks 15. The first plane 30 is located below the second plane 150, and a certain gap is provided therebetween, thereby ensuring contact between the solder balls 3 and the pad of the circuit board 300, and preventing from missing solder of the conductive portion 23 and short-circuiting of the terminal 2.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, mounted on a circuit board, and configured to be electrically connected to an electrical module, the electrical connector comprising:
    an insulating body; and
    a plurality of terminals, provided on the insulating body, wherein at least one of the terminals has:
        a conductive portion, configured to electrically connect the terminal to the circuit board;
        a connecting portion;
        an elastic arm, bending and extending upward from the connecting portion, the elastic arm configured to be electrically connected to the electrical module;
        two extending arms, extending from the connecting portion, each of the two extending arms having a free tail end; and
        an electrical connecting portion, located at one of the free tail ends of the two extending arms, and configured to electrically connect the two extending arms,
        wherein the two extending arms and the connecting portion form a tubular structure, and the electrical connecting portion connects the two extending arms, such that the tubular structure forms a closed loop.

2. The electrical connector of claim 1, wherein the electrical connecting portion is a metal sheet fixed to the one of the free tail ends of the two extending arms, and configured to connect the two free tail ends of the two extending arms.

3. The electrical connector of claim 1, wherein the two extending arms are provided to be bending, and the two free tail ends of the two extending arms face each other.

4. The electrical connector of claim 1, wherein each of the two free tail ends of the two extending arms has an end portion, the end portion is a cutting surface of the corresponding extending arm, and the two end portions of the two free tail ends are parallel and opposite to each other and abut each other to form electrical conduction.

5. The electrical connector of claim 1, wherein the two free tail ends of the two extending arms and the connecting portion are opposite to each other in a direction perpendicular to the connecting portion.

6. The electrical connector of claim 1, wherein the insulating body has a plurality of terminal grooves configured to accommodate the terminals, each of the terminal grooves has a plurality of walls surrounding the terminal groove, a fastening block protrudes from one of the walls, and one of the free tail ends is torn to form a fastening sheet configured to limit and fit with the fastening block.

7. The electrical connector of claim 1, further having a solder provided on the conductive portion, wherein the solder is a solder column, an upper end of the solder column is flush with an upper end of each of the extending arms, and a lower end of the solder column extends downward beyond the conductive portion.

8. The electrical connector of claim 1, wherein the elastic arm has a base end connected to the connecting portion and a contact portion formed by bending from the base end, the contact portion is configured to be electrically connected to the electrical module, and the two extending arms are located below the base end.

9. The electrical connector of claim 8, wherein at least one protruding portion laterally protrudes from the base end, and is configured to be interference fixed with the insulating body in an interference manner.

10. The electrical connector of claim 8, wherein the contact portion has a through slot, such that the contact portion forms two contact points located on two sides of the through slot, and a hollow portion of the tubular structure is exposed through the through slot viewing downward from top thereof.

11. The electrical connector of claim 1, further having a solder provided on the conductive portion, and the solder does not extend upward beyond the extending arms.

12. The electrical connector of claim 11, wherein the conductive portion extends downward from the connecting portion, the conductive portion bends to form a conductive surface, the solder is provided on the conductive surface, and the conductive surface overlaps with projections of the extending arms, the elastic arm and the solder in a vertical direction.

13. The electrical connector of claim 11, wherein lower ends of the two extending arms and a lower end of the connecting portion jointly form the conductive portion.

14. The electrical connector of claim 13, wherein the elastic arm has a through slot, and the solder is exposed through the through slot viewing downward from top thereof.

15. An electrical connector, mounted on a circuit board, and configured to be electrically connected to an electrical module, the electrical connector comprising:
    an insulating body; and
    a plurality of terminals, provided on the insulating body, wherein at least one of the terminals has:
        a conductive portion, configured to electrically connect the terminal to the circuit board;
        a connecting portion;
        an elastic arm, bending and extending upward from the connecting portion, the elastic arm configured to be electrically connected to the electrical module;
        two extending arms, extending from the connecting portion, each of the two extending arms having a free tail end; and
        an electrical connecting portion, located at one of the free tail ends of the two extending arms, and configured to electrically connect the two extending arms,
        wherein a solder is provided on the conductive portion, the solder does not extend upward beyond the extending arms, the conductive portion extends downward from the connecting portion, the conductive portion bends to form a conductive surface, the solder is provided on the conductive surface, and the conductive surface overlaps with projections of the extending arms, the elastic arm and the solder in a vertical direction.

16. The electrical connector of claim 15, wherein one of the free tail ends of the two extending arms has an end portion, and the end portion is the electrical connecting portion, configured to directly connect the other one of the free tail ends of the two extending arms.

17. The electrical connector of claim 15, wherein the two extending arms and the connecting portion form a tubular structure, and the electrical connecting portion connects the two extending arms, such that the tubular structure forms a closed loop.

18. The electrical connector of claim 15, wherein the two free tail ends of the two extending arms and the connecting portion are opposite to each other in a direction perpendicular to the connecting portion.

19. The electrical connector of claim 15, wherein the two extending arms are provided to be bending, and the two free tail ends of the two extending arms face each other.

20. The electrical connector of claim 19, wherein each of the two free tail ends has an end portion, the end portion is a cutting surface of the corresponding extending arm, and the two end portions of the two free tail ends are parallel and opposite to each other.

21. The electrical connector of claim 15, wherein the elastic arm has a base end connected to the connecting portion and a contact portion formed by bending from the base end, the contact portion is configured to be electrically connected to the electrical module, and the two extending arms are located below the base end and above the conductive portion.

22. The electrical connector of claim 21, wherein each of two sides of the base end has one protruding portion respectively, and the two protruding portions at the two sides of the base end are provided to be vertically staggered.

* * * * *